United States Patent [19]

Paranjpe et al.

[11] Patent Number: 5,389,153
[45] Date of Patent: Feb. 14, 1995

[54] PLASMA PROCESSING SYSTEM USING SURFACE WAVE PLASMA GENERATING APPARATUS AND METHOD

[75] Inventors: Ajit P. Paranjpe, Plano; Steve S. Huang, Richardson, both of Tex.

[73] Assignee: Texas Instruments Incorporated, Dallas, Tex.

[21] Appl. No.: 19,941

[22] Filed: Feb. 19, 1993

[51] Int. Cl.$^6$ .......................... C23C 16/50; H05H 1/46
[52] U.S. Cl. .................... 118/723 MP; 118/723 ME; 118/723 IR; 118/723 MW; 315/111.210; 315/111.510
[58] Field of Search ...................... 315/111.01, 111.21, 315/111.41, 111.51; 313/231.31; 204/298.38; 118/723 MW, 723 MP, 723 ME, 723 IR

[56] References Cited

U.S. PATENT DOCUMENTS

| | | | |
|---|---|---|---|
| 4,611,108 | 9/1986 | Leprince et al. | 315/111.21 X |
| 4,810,933 | 3/1989 | Moisan et al. | 315/39 |
| 4,908,492 | 3/1990 | Okamoto et al. | 315/111.21 X |
| 4,933,650 | 6/1990 | Okamoto | 315/111.41 X |
| 5,028,847 | 7/1991 | Greb et al. | 315/111.21 X |
| 5,063,329 | 11/1991 | Okamoto | 315/111.21 |
| 5,086,255 | 2/1992 | Okamoto et al. | 315/111.21 |

OTHER PUBLICATIONS

1987 American Institute of Physics, Rev. Sci. Instrum 58 (10) Oct. 1987, "New Surface Wave Launchers for Sustaining Plasma Columns at Submicrowave Frequencies (1-300 MHz)" by M. Moisan and Z. Zakrzewski, pp. 1895-1900.

Primary Examiner—Benny T. Lee
Attorney, Agent, or Firm—John D. Crane; Richard L. Donaldson

[57] ABSTRACT

A surfatron 12 is provided which includes first waveguide 32 coupled to a section of coaxial waveguide 30 to define a cavity 28 at the intersection therebetween. The coaxial waveguide 30 includes an outer cylinder 36 and an inner cylinder 34 disposed within the outer cylinder 36. Inner cylinder 34 has an end disposed proximate to a wall of first section of waveguide 32. A space 40 is defined between the end of inner cylinder 34 and the wall of waveguide 32. A discharge tube 22 is provided having a first portion disposed within inner cylinder 34 and a second portion extending through space 40 between the end of inner cylinder 34 and the wall of waveguide 32. A coil 38 is disposed around the portion of discharge tube 22 extending through space 40 between the end of inner cylinder 34 and the wall of waveguide 32.

20 Claims, 3 Drawing Sheets

PLASMA PROCESSING SYSTEM USING SURFACE WAVE PLASMA GENERATING APPARATUS AND METHOD

TECHNICAL FIELD OF THE INVENTION

The present invention relates in general to plasma generation and in particular to plasma generation apparatus and methods.

BACKGROUND OF THE INVENTION

Remote microwave plasmas are routinely used in semiconductor processing for the generation of radical species for etching and deposition. Remote microwave sources generate intense electric fields within a cavity to form a plasma which then diffuses into the processing chamber as an afterglow plasma. While conventional cavity devices employ a simple construction, they suffer from several drawbacks. Since the plasma is itself a lossy dielectric, its presence in the cavity modifies the initial electric field distribution resulting in a substantial change in the impedance of the cavity. Often the associated tuning stubs have to be adjusted after the plasma has been generated to achieve a proper impedance match and optimum power coupling. Further, the power dissipation occurs within the entire cavity and proper cooling of the cavity is essential, since at high power levels the discharge tube may be damaged by the high thermal load. Finally, transport of the plasma outside the cavity occurs solely by diffusion. Thus the afterglow plasma in the chamber may be quite weak. Surface wave discharges offer several advantages over cavity sustained discharges. Unlike conventional cavity sustained discharges, the plasma is generated in a short gap, which is only a small portion of the entire cavity such that the cavity operates much cooler, except in the vicinity of the short gap. Only a small fraction of the total power is dissipated in the short gap; the rest is radiated. Thus, the impedance of the cavity, unlike conventional cavities, is not sensitive to the plasma conditions. Further, the surface wave propagating along the discharge tube produces long plasma columns providing a denser plasma within the chamber. Compared to conventional cavities which require a 3 or 4 stub tuner, impedance matching for the surface wave discharge is achieved by moveable shorts in the coaxial and rectangular waveguide sections. Thus tuning is simple and relatively independent of plasma conditions because of the nature of the cavity.

The conventional surface wave plasma generators however also have substantial disadvantages. Higher power surface waves are characterized by stronger electric fields. The maximum power handling capacity is limited by electric field induced breakdown in the gap. If the field becomes too intense, arcing can occur in the gap causing failure. Even if arcing does not occur, the short gap may become extremely hot. If the gap is too long, surface waves cannot be launched into the discharge tube. Additionally, for certain geometries and process conditions it is difficult to strike a plasma without the aid of an external trigger, such as an electric spark or a Tesla coil. Both these external triggers are a source of electrical noise in the reactor, and are therefore undesirable. Finally a minimum plasma column length is required to completely absorb the microwave power.

Thus the need has arisen for improved methods and apparatus for generating microwave plasmas. Such improved apparatus and methods should generate a plasma without the need for extensive tuning and cooling mechanisms. Further, the improved apparatus and methods should generate sufficiently strong plasmas for use in such applications such as semiconductor fabrication systems.

SUMMARY OF THE INVENTION

According to the invention, a surfatron is provided comprising a first section of waveguide and a section of coaxial waveguide coupled to the first section of waveguide to define a cavity at the intersection of the two sections. The coaxial waveguide includes an outer cylinder and a moveable inner cylinder disposed within the outer cylinder with a space being defined between a portion of the inner cylinder and a portion of the outer cylinder. One end of the inner cylinder is disposed proximate to a wall of the first waveguide, an adjustable space thereby being defined between the end and the wall. A discharge tube is provided having a first portion disposed within the inner cylinder and a second portion extending through the space between the end of the inner cylinder and the wall. A coil is disposed around the portion of the discharge tube extending through the space between the end of the inner cylinder and the wall.

The surface wave plasma generator, referred to herein for convenience as a surfatron, according to the present invention alleviates the substantial disadvantages inherent in conventional plasma generation devices. Embodiments of the present invention allow for the generation of a plasma without the need for extensive tuning and cooling mechanisms. Further, embodiments of the present invention allow for the generation of sufficiently strong plasmas for use in applications such as semiconductor fabrication systems.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
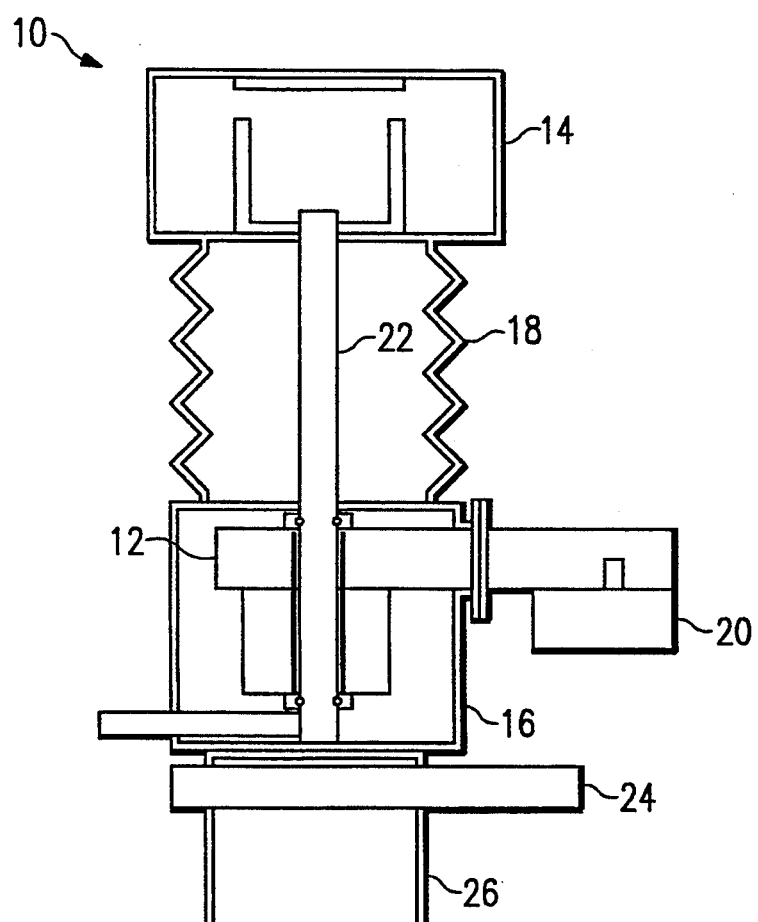
FIG. 1 is a cross-sectional diagram of a semiconductor fabrication system employing plasma generation methods and apparatus embodying the present invention.
Figure 2:
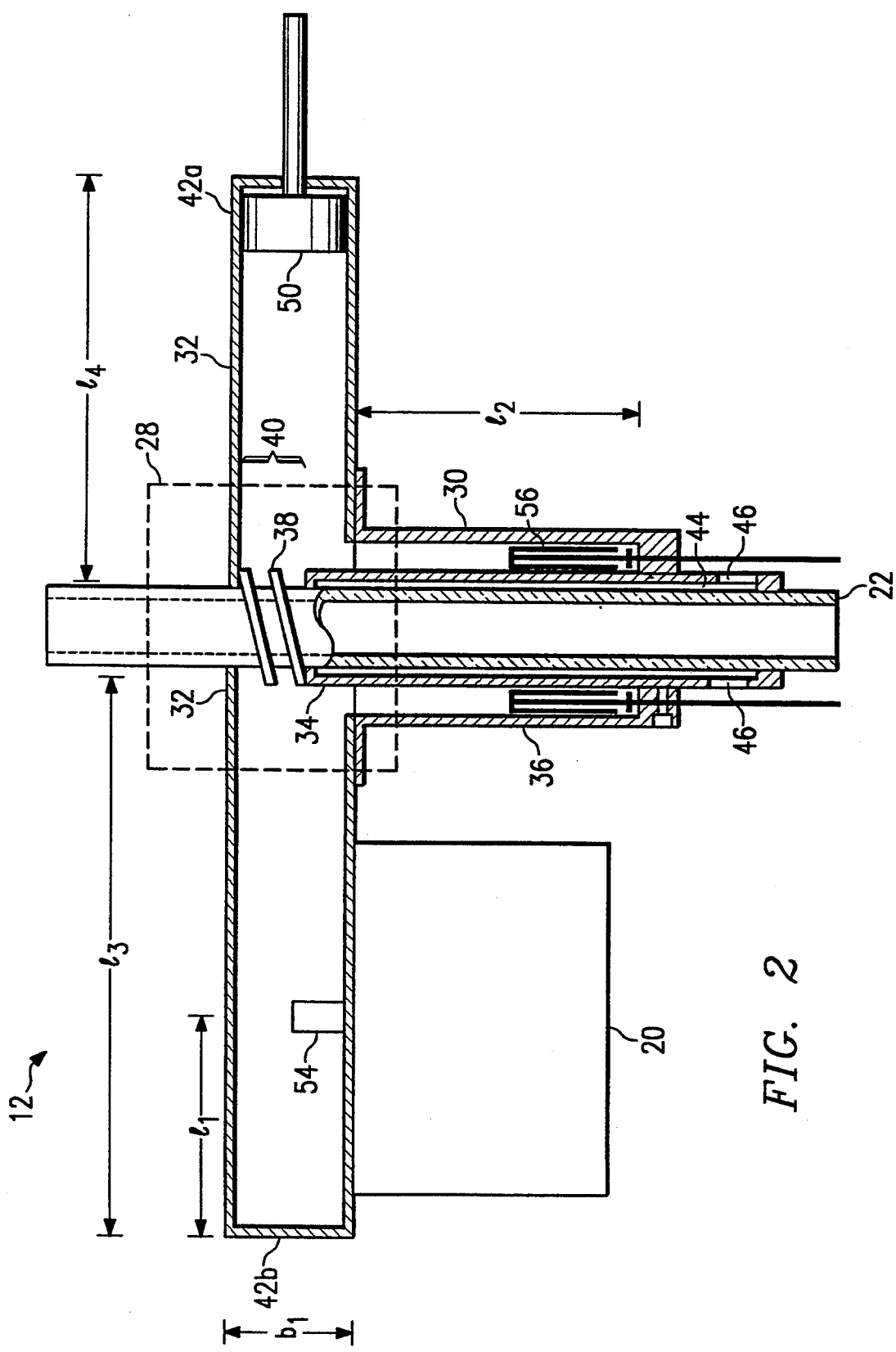
FIG. 2 is a cross-sectional diagram of a plasma generation apparatus embodying the principals of the present invention.
Figure 3:
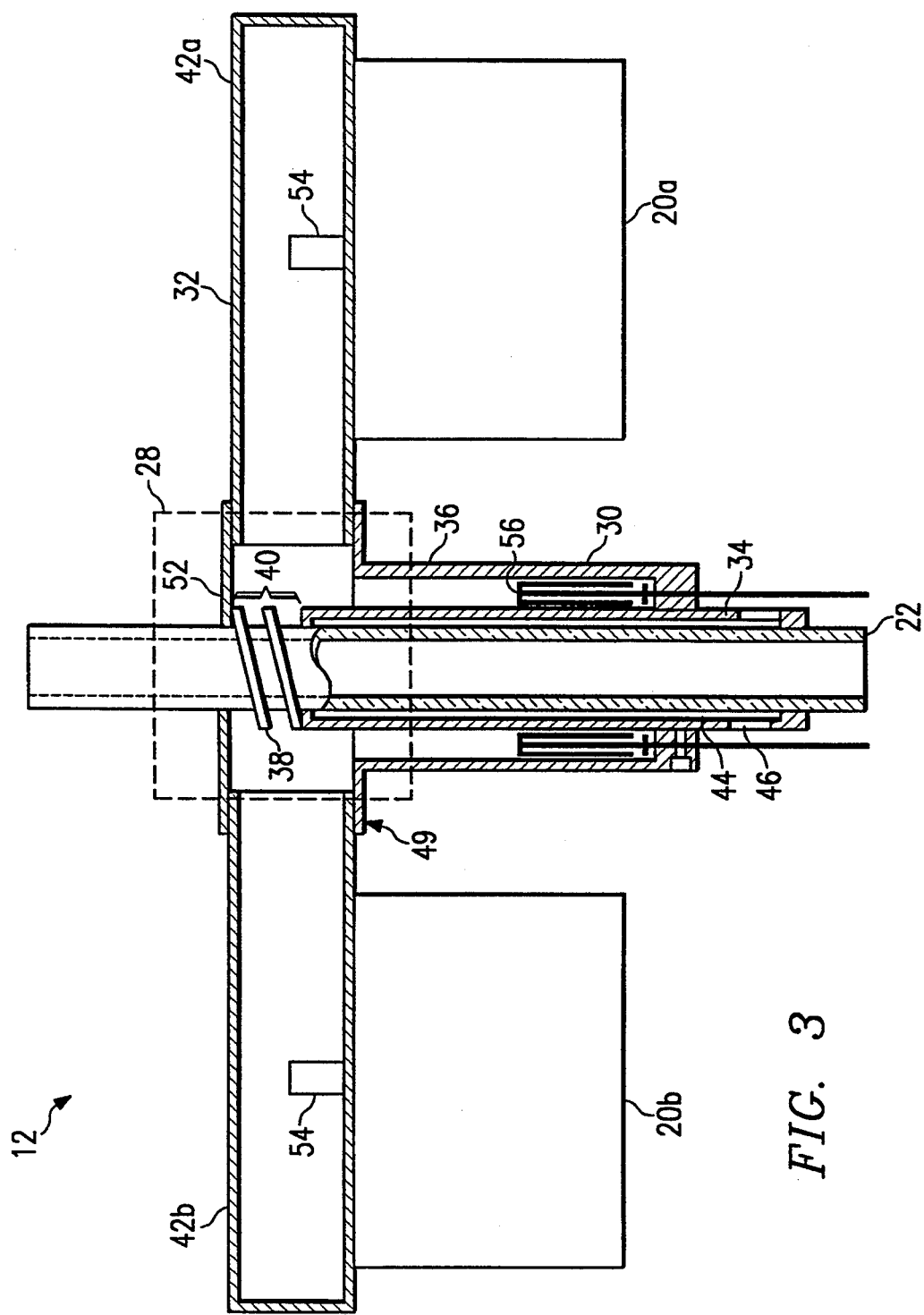
FIG. 3 is a cross-sectional diagram of a second embodiment of a plasma generation apparatus employing the principals of the present invention.

The preferred embodiment of the present invention and its advantages are best understood by referring to FIGS. 1 through 3 of the drawings, like numerals being used for like and corresponding parts of the various drawings.

Referring first to FIG. 1, a semiconductor processing system 10 is depicted using an improved surfatron surface wave (plasma generator) 12 according to embodiments of the present invention. Processing system 10 includes process chamber 14 coupled to a chamber 16 by bellows 18. Chamber 16 contains surfatron 12 which, as discussed further below, operates in conjunction with a magnetron 20 or other suitable source of electromagnetic power. A discharge tube 22 extends through surfatron 12 to process chamber 14. Discharge tube 22 receives the gas from which the plasma is to be generated at one end and delivers the resulting plasma to process chamber 14 through the opposite end. Gate valve 24 and turbo pump 26 are used to remove gaseous materials from process chamber 14.

FIG. 2 illustrates an embodiment of a resonantly coupled waveguide surfatron 12 employing the present inventive concepts. A short gap cavity, shown generally by dotted lines at 28, is formed by the intersection of a coaxial waveguide 30 with a rectangular waveguide 32. Coaxial waveguide 30 includes a moveable cylindrical inner conductor 34 and a cylindrical outer conductor 36. Inner conductor 34 of coaxial waveguide 30 can be moved axially to adjust the length of a solenoidal coil 38 placed in the gap 40 between the end of inner conductor 34 and upper wall of rectangular waveguide 32. In the illustrated embodiments, solenoidal coil 38 is a short two turn coil wrapped around the discharge tube 22, with one end affixed to the end of inner conductor 34 and the other end coupled to the upper wall 41 of coaxial waveguide section. Discharge tube 22 may fabricated for example out of a dielectric such as pyrex, quartz or sapphire, as selected to be compatible with the gas flowing therethrough. A thin annular space 44 between the inner coaxial conductor 34 and the discharge tube 22 is provided for forced air cooling of the unit through ports 46. Oil (microwave compatible grade) cooling may also be used instead of air cooling.

Rectangular waveguide section 32 includes two arms 42a and 42b. In the illustrated embodiment of FIG. 2, one magnetron head 20 is used, mounted on arm 42b while a contactless plunger 50 is installed within the waveguide walls of arm 42a. In the configuration of FIG. 2 the two arms 42a and 42b can be fixed in position, with plunger 50 allowing for adjustment of the maximum power coupling into the gap. FIG. 3 depicts an alternate embodiment in which two magnetron heads 20a and 20b are used. In this embodiment, arms 42a and 42b are inserted into the ends of fixed waveguide section 49 such that they are slidable allowing adjustment to maximize the power coupling into gap 40. A plate 52 covers an opening in the waveguide 32. This plate 52 has a circular opening through which extends the discharge tube 22. In alternate embodiments, additional rectangular waveguide arms and magnetrons may be coupled to short gap cavity 28.

The magnetron coaxial antenna 54 launches the $TE_{10}$ mode waves into the rectangular waveguide 32. This in turn generates TEM mode waves in the coaxial section 30. By adjusting the rectangular waveguide plunger in FIG. 2 (in the embodiment of FIG. 3, sliding the arms 42a and 42b) and the coaxial plunger 56 in coaxial section 30, intense time varying electric fields are created across gap 40. Plunger 56 in the coaxial section, which is preferably a contactless plunger, ensures that the short gap cavity 28 is resonant while waveguide plunger 50 matches the output impedance of the antenna 54 to the net input impedance of the coaxial section 30, gap 40 and waveguide 32. In the preferred embodiment, the short gap microwave cavity 28 is designed so that the capacitance of gap 40 is larger than the capacitance of coaxial section 30. The electromagnetic fields across gap 40 in turn generates current through coil 38. By adjusting the spacing of gap by sliding inner conductor 34, the inductance of coil 38 can be made to resonate with the capacitance of the gap 40 at the microwave frequency resulting in resonant coupling. The intense time-varying electromagnetic fields generated by the gap 40 and coil 38 propagates through dielectric discharge tube 22 thereby ionizing the gas flowing towards the process chamber 14. It should be noted that in alternate embodiments, plungers 50 and 56 may be replaced by welded shorts since the net impedance of short gap cavity 28 and coil 38 is relatively independent of the plasma operating conditions.

For illustration purposes only, the design calculations for a surfatron 12 according to the embodiment of FIG. 2 and operating a nominal frequency of 2.5 GHz will be shown (operating frequencies range from 500 MHz–10 GHz.) It is important to note that numerous alternate embodiments are available depending on the desired operating frequency, the available waveguides and the available sources of electromagnetic energy.

The representative calculations for rectangular waveguide 32 operating at 2.45 GHz are as follows:
operating frequency=2.45 GHz
assume that rectangular waveguide is WR340 waveguide having cross-sectional dimensions of $a_1 = 3.4$ inches and $b_1 = 1.7$ inches $$\text{then cutoff frequency} = \frac{c}{2a_1} \text{ or } 1.736 \text{ GHz}$$

Dimensions $l_1$, the distance from the end of either arm 42a or 42b to the center of the corresponding antenna 54 can then be calculated according to the formula:

$$\frac{\lambda_g}{\lambda_0} = \frac{1}{\left[1 - \left(\frac{f_c}{f}\right)^2\right]^{\frac{1}{2}}}$$

where:
$\lambda_0$ = free space wavelength (cm)
$\lambda_g$ = guide wavelength (cm)
$f_c$ = cutoff frequency (Hz)
$f$ = operating frequency (Hz) for the $TE_{10}$ mode
$\lambda_0 = 12.2$ cm for 2.45 GHz then $\lambda_g = 17.3$ cm and $$l_1 = \frac{\lambda_g}{4} = 4.3 \text{ cm} = 1.7''$$

In the illustrated embodiment a discharge tube 22 has a one inch nominal tube diameter, an inner diameter of 23 mm and an outer diameter of 25 mm. Forced air flow between the inner conductor 34 and the tube 22 allows for cooling. A maximum heat transfer can be achieved if space 44 is approximately 1 mm. A typical thickness of inner conductor of 2 mm through 3 mm will provide sufficient gap capacitance; the inside diameter of inner conductor 34 is therefore nominally 27 mm and the outside diameter nominally 30 mm.

The coaxial cavity is designed to operate in the TEM mode such that the TE and TM modes are disallowed. For an operating frequency of 2.45 GHz, the ratio of the outside diameter of the inner conductor 34 to the inside diameter of the outer conductor 36 is selected to be in the range of 1.4 to 1.7.

The length $l_2$ of the coaxial cavity should be approximately one-half the free space wavelength. Coaxial plunger 56 is used to vary the length of the coaxial cavity such that the resonant length of the short gap cavity may be on the order of two to three times less than that of the overall coaxial cavity. The $l_2$ length of the coaxial cavity may be estimated as follows:

$$\tan\left(\frac{wl_2}{c}\right) = \frac{1}{Z_0 w C_g}$$

where:

$$Z_0 = \frac{60}{\sqrt{\epsilon_r}} \ln \frac{b}{a}$$

and where:
$Z_0$ is the characteristic impedance of the coaxial section (ohms)
w=angular operating frequency (radians/sec)
$C_g$ is the capacitance of gap 40 without coil 38 (farads)
b/a is the ratio of the nominal radius of outer conductor 36 to the nominal radius inner conductor 34
$l_2$=resonant length of the short gap cavity 28 (m)
$\epsilon_r$ is the relative permittivity of the dielectric in the cavity which typically is air ($\epsilon_r \sim 1$)

The gap capacitance (without coil 38) can be calculated as:

$$C_g = \epsilon_0 \frac{\pi}{4}(d_o^2 - d_i^2)/d_g$$

where:
$d_O$=outside diameter of inner conductor 34
$d_I$=inside diameter of inner conductor 34 (m)
$d_g$=length of gap 40 (m)

Notwithstanding the adjustment capability of inner conductor 34 and no coil 38, the length of gap 40 should be large enough to avoid arcing. The electric field for a nominal 1000 W of microwave power travelling in waveguide 32 can be approximated as:

$$1000 = \frac{E^2}{Z_{TE}}(a_1 b_1)$$

where:
E=electric field
$Z_{TE}$=impedance of waveguide for transverse electric mode; and $$Z_{TE} = \frac{377/\sqrt{\epsilon_r}}{\sqrt{1 - f_c^2/f^2}} = 534 \Omega$$

and $a_1$ and $b_1$ are the cross-sectional dimensions of rectangular waveguide 32 ($a_1$=3.4 inches, perpendicular to the plane of the paper in FIGS. 2 and 3, $b_1$=1.7 inches for WR340 waveguide).

Therefore E=120 V/cm.

To prevent microwave breakdown at atmospheric pressure, the field in the gap 40 should be less than 1 KV/cm. This leads to a minimum gap of 2 mm. Therefore, $d_g$ (length of gap 40) can be chosen for calculation purposes in this example to be 3 mm. From this Cg=0.4 pF4 $Z_0$=30.6 $\Omega$. Therefore, the solutions for $l_2$ are $l_2$=27.9 mm and 89.2 mm. For optimization, $l_2$ should be selected to between these two values. For this example, $l_2$ is taken as 80 mm.

The next dimensions to be determined in this example are $l_3$ and $l_4$ (the lengths of the arms). Both should be on the order of half the guide wavelength $\lambda_g$ previously calculated. For the convenience of mounting the plunger 50, $l_3$, is taken to be 8 inches and $l_4$ as five inches in the embodiment of FIG. 2. The plunger allows one degree of freedom for impedance matching. In the embodiment of FIG. 3, $l_3$ and $l_4$ are essentially equal; the two slidable arms 42 allowing two degrees of freedom for impedance matching.

The above calculations provide the nominal dimensions for the given example without the coil 40 included. The design is now modified to add the coil. In the preferred embodiment, coil 38 has been designed to satisfy several constraints. The inside diameter of the coil 38 matches the outside diameter of discharge tube 22. The length of the coil should be compatible with air gap 40. Additionally, at 2.45 GHz, the inductance should resonate with the capacitance of short gap 40. Finally, coil 38 should have a high Q factor to minimize coil heating and improved coupling efficiency. In the illustrated example, the capacitance of the short gap cavity can be approximated as follows:

Gap 40 is substantially increased to accommodate coil 38. Assuming a nominal adjustment of gap 40 to be 0.77 cm, the capacitance becomes approximately 0.09 pf. In the illustrated example, coil 38 can be nominally characterized as follows:

Number of turns N=2
Coil radius R=0.625 cm
Wire radius=0.1 cm
Coil lengthen l=0.765 cm
Inductance L=0.046 $\mu$H
Frequency=2.45 GHz
Wire Length=7.85 cm for a copper coil
Skin depth=$1.32 \times 10^{-4}$ cm for a copper coil
Conductance $\sigma$=$5.9 \times 10^5$ mho/cm for a copper coil
Wire resistance=0.16 ohm
Q=$4.5 \times 10^3$
where:

$$\text{Inductance } L = \frac{\pi \mu_0 R^2 N^2}{l + 0.9R}$$

where:
$\mu_0$=$4\pi \times 10^{-7}$ H/m;

$$\text{Skin depth } \delta = \frac{1}{\sqrt{\pi f \mu \sigma}}; \text{ and}$$

$Q=wL/R$

The illustrated embodiments depicted in FIGS. 2 and 3 alleviate the problems found with standard short gap plasma generators. Resonant coupling enhances the power handling capacity of the cavity. At resonance, large currents circulate between coil 38 and the gap 40 capacitor. The plasma will be sustained by the surface wave launched by gap 40 in superposition with eddy currents induced by the solenoidal coil 38. This duality improves plasma stability over a wide range of operating conditions. At the higher pressures power coupling is mainly by coil 38, while coupling by the surface wave predominates at lower pressures. The presence of the solenoidal coil 38 increases the power dissipation density. By adjusting the coil parameters, the plasma column length may be optimized for a given power level. Finally, during startup, the two turn coil functions as a Tesla coil to aid plasma ignition.

High power microwave supplies are expensive compared to the low power (<600 W) supplies which are standard in microwave ovens. Advantageously, in the embodiment of FIG. 3, two relatively low power 600 W magnetron heads are provided which generate a total power capability of 1200 W. The additional power capability is further enhanced by the use of coil 38 which increases the intensity of the fields in gap 40. Additional arms 42 and magnetrons 20 may be coupled to short gap cavity 28 to further enhance the available power.

Although the present invention and its advantages have been described in detail, it should be understood that various changes, substitutions and alterations can be made herein without departing from the spirit and scope of the invention as defined by the appended claims.

What is claimed is:

1. A plasma generator comprising, in combination:
a first waveguide;
a coaxial waveguide, coupled to said first waveguide, to define a cavity at an intersection between said coaxial waveguide and said first waveguide, said coaxial waveguide comprising:
an outer cylinder having a longitudinal axis of symmetry;
an inner cylinder slidably disposed within said outer cylinder near one end thereof distal said cavity, an opposite end thereof extending into said cavity to a position proximate a wall of said first waveguide;
a discharge tube disposed within said inner cylinder and extending from said distal end through said cavity and said first waveguide; and
a coil disposed around said discharge tube and extending from the opposite end of said inner cylinder proximate said wall to said wall of said first wave guide.

2. The plasma generator of claim 1 wherein said first waveguide comprises a section of rectangular waveguide including first and second arms each disposed at a respective angle to said section of coaxial waveguide.

3. The plasma generator of claim 2 and further comprising a first electromagnetic power source coupled to said first arm.

4. The plasma generator of claim 3 and further comprising a second electromagnetic power source coupled to said second arm.

5. The plasma generator of claim 2 and further comprising a plunger disposed within said second arm of said section of rectangular waveguide.

6. The plasma generator of claim 1 and further comprising a plunger disposed within a space defined between said inner cylinder and said outer cylinder.

7. The plasma generator of claim 1 wherein said section of rectangular waveguide comprises a fixed section having first and second ends and first and second arms, said first arm slidably affixed in said first end and said second arm slidably affixed in said second end of said fixed section.

8. The plasma generator of claim 1 wherein said inner cylinder is slidable in a direction parallel to the axis of symmetry of said outer cylinder such that a distance between said opposite end of said inner cylinder and said wall is adjustable.

9. The plasma generator of claim 1 wherein said first waveguide comprises a plurality of sections of rectangular waveguide.

10. A plasma generator comprising, in combination:
a section of rectangular waveguide including first and second arms;
an electromagnetic power source coupled to one of said arms;
a section of coaxial waveguide coupled through a first wall of said section of rectangular waveguide to define a cavity therebetween, said section of coaxial waveguide comprising:
a first cylinder;
a second cylinder slidably disposed within said first cylinder with one end thereof being proximate a second wall of said section of rectangular wave guide opposite said first wall, a space positioned between portions of said first and second cylinders defining a portion of said cavity, a distance between said one end of said second cylinder disposed proximate to said second wall being adjustable; and
a coaxial plunger disposed in said space between said portions of said first and second cylinders;
an elongated discharge tube having a first portion disposed within said second cylinder and a second portion extending through said space between said end of said second cylinder and said second wall of said rectangular waveguide; and
a coil disposed around said second portion of said discharge tube.

11. The plasma generator of claim 10 wherein said discharge tube comprises a sapphire tube.

12. The plasma generator of claim 10 wherein said plunger comprises a contactless plunger.

13. The plasma generator of claim 10 wherein said electromagnetic power source comprises a magnetron.

14. The plasma generator of claim 10 wherein an additional plunger is disposed within one of said arms.

15. The plasma generator of claim 10 wherein said discharge tube comprises a quartz tube.

16. A processing system comprising, in combination:
a processing chamber;
a plasma generator comprising:
a section of rectangular waveguide including first and second arms;
a magnetron coupled to one of said arms;
a section of coaxial waveguide coupled through a first wall of said section of rectangular waveguide to define a cavity therebetween, said section of coaxial waveguide comprising:
a first cylinder;
a second cylinder slidably disposed within said first cylinder, a space disposed between portions of said first and second cylinders defining a portion of said cavity, an end of said second cylinder disposed proximate to a second wall of said rectangular waveguide and defining a space therebetween; and
an elongated discharge tube disposed proximate one end thereof within said second cylinder, said discharge tube extending out of said second cylinder, through said second wall and into said processing chamber for providing plasma thereto; and
a coil disposed around said discharge tube in the portion of said discharge tube disposed between said second cylinder and said second wall; and
a gas source coupled to the end of said discharge tube proximate said second cylinder.

17. The processing system of claim 16 and further comprising a second magnetron coupled to another one of said arms.

18. The processing system of claim 16 wherein said plasma generator further comprises a coaxial plunger disposed in said space between said corresponding portions of said first and second cylinders.

19. A method of generating a plasma comprising the steps of:

forming a microwave cavity at an intersection between a section of rectangular waveguide which has four walls and a section of a coaxial waveguide which has an inner and an outer conductor;

disposing the inner conductor of the coaxial waveguide in the cavity to form a capacitive gap between the inner conductor and one of said four walls of the rectangular waveguide;

positioning a portion of a discharge tube carrying a preselected gas in the capacitive gap;

forming a coil around the portion of the discharge tube positioned in the capacitive gap; and forming an electromagnetic field in the capacitive gap at a frequency selected to induce a current in the coil thereby causing gas carried in the tube proximate the coil to be ionized.

20. The method of claim 19 further comprising the step of maximizing the ionization of gas in the portion of the discharge tube disposed in the capacitive gap by adjusting the position of the inner conductor so that a resonant frequency, associated with the coil and a capacitance formed between the inner conductor and the rectangular waveguide, is the same as said selected frequency of the electromagnetic field.

* * * * *